United States Patent [19]

Itoh et al.

[11] 4,260,430
[45] Apr. 7, 1981

[54] METHOD OF MANUFACTURING A SEMICONDUCTOR DEVICE

[75] Inventors: Kazuo Itoh, Kodaira; Katsumi Ogiue, Hinode; Akio Hayasaka, Yamato, all of Japan

[73] Assignee: Hitachi, Ltd., Tokyo, Japan

[21] Appl. No.: 50,202

[22] Filed: Jun. 20, 1979

Related U.S. Application Data

[60] Division of Ser. No. 852,978, Nov. 18, 1977, which is a continuation of Ser. No. 608,734, Aug. 28, 1975, abandoned.

[30] Foreign Application Priority Data

Sep. 6, 1974 [JP] Japan .................. 49-102100

[51] Int. Cl.³ ............... H01L 21/263; H01L 7/36
[52] U.S. Cl. ................................. 148/1.5; 148/187; 357/34; 357/91
[58] Field of Search ............... 148/1.5, 187; 357/9.1, 357/34

[56] References Cited

U.S. PATENT DOCUMENTS

| 3,581,165 | 5/1971 | Seelbach | 317/235 |
|---|---|---|---|
| 3,756,861 | 9/1973 | Payne et al. | 148/1.5 |
| 3,764,396 | 10/1973 | Tarui et al. | 148/1.5 |
| 3,793,093 | 2/1974 | Nishizawa et al. | 148/186 |
| 3,879,230 | 4/1975 | Nakamura et al. | 148/1.5 |
| 3,886,004 | 5/1975 | Bruchez | 148/187 |
| 3,895,390 | 7/1975 | Meiling et al. | 357/23 |
| 3,961,340 | 6/1976 | Encinas | 357/40 |
| 3,971,059 | 7/1976 | Dunkley | 357/44 |
| 4,001,048 | 1/1977 | Meiling et al. | 148/1.5 |
| 4,007,474 | 2/1977 | Yagi et al. | 357/34 |
| 4,056,810 | 11/1977 | Hart et al. | 365/205 |

Primary Examiner—L. Dewayne Rutledge
Assistant Examiner—Upendra Roy
Attorney, Agent, or Firm—Craig and Antonelli

[57] ABSTRACT

An $I^2L$ device is disclosed wherein the P type injector region of a PNP transistor is formed so as to be buried in an $N^-$ type epitaxial layer below the P type collector region of the PNP transistor, whereby the carrier injection efficiency of the transistor is improved and a high switching speed is obtained. The $I^2L$ device further includes an inversed NPN transistor wherein the abovementioned P type collector region of the PNP transistor works as a base region of the NPN transistor, an N type collector region is formed in the P type base region, and the abovementioned P type injector region extends between the $N^-$ type epitaxial layer and an $N^+$ type substrate except below the N type collector region so that the effective emitter portion of the NPN transistor is limited to a specific area immediately below the N type collector region, thereby to reduce the power consumption.

5 Claims, 4 Drawing Figures

METHOD OF MANUFACTURING A SEMICONDUCTOR DEVICE

CROSS-REFERENCE TO RELATED APPLICATION

This application is a divisional of U.S. Pat. Application Ser. No. 852,978 entitled SEMICONDUCTOR INTEGRATED CIRCUIT DEVICE AND METHOD OF PRODUCING SAME, filed Nov. 18, 1977, which is a continuation of U.S. Pat. Application Ser. No. 608,734, entitled "SEMICONDUCTOR INTEGRATED CIRCUIT DEVICE AND METHOD OF PRODUCING SAME", filed Aug. 28, 1975 now abandoned.

BACKGROUND OF THE INVENTION

This invention relates to a semiconductor integrated circuit and a method of manufacturing the same, and more particularly to a semiconductor integrated injection logic circuit device and a method of manufacturing the same.

The integrated injection logic circuit (hereinafter referred to as the I$^2$L circuit) is of a simple structure totally different from the conventional bipolar logic circuit, and such I$^2$L circuit conception is described in, for instance, Nikkei Electronics, May 6, 1974, pp. 85–90, and U.S. Pat. Nos. 3,736,477 and 3,816,758. The basic arrangement of the gate circuit thereof is shown in FIG. 3a and its structural diagram is shown in FIG. 3b. The most salient feature of this circuit is that there are used a complementary pair of transistors. An NPN transistor Q1 of the multicollector type is disposed vertically in the substrate to act as an inverter, while a lateral PNP transistor Q2 acts as a constant current source to feed current to the collector of the NPN transistor of the previous stage (not shown) connected to a base 52 of the NPN transistor Q1 or to an input terminal B. This lateral PNP transistor also functions as a collector load of the NPN transistor of the preceding stage. An emitter 51 of this lateral PNP transistor is generally called an injector because it feeds current.

Such a gate circuit, as shown in FIG. 3b, can be constituted only from transistors without using any resistance for both the power source and the load. That is, an n+ substrate 1 forms the common emitter En of the gate transistor Q1 and island-like n+ layers 61, 62, 63 are arranged spaced-apart from each other close to the surface to form multicollectors C1–C3. Thus, this circuit is characterized in that the NPN transistors are constituted from inverted transistors where the substrate 1 is designed to act as an emitter.

SUMMARY OF THE INVENTION

It is an object of the invention to improve the I$^2$L circuits while increasing the switching speed.

According to one embodiment of the present invention designed for accomplishing the above-mentioned object, there is provided a semiconductor integrated circuit device of an I$^2$L structure characterized in that a buried layer is formed at a part in the emitter region positioned immediately beneath the base region of the NPN transistor acting as an inverter and not containing the area immediately beneath the collector region of the NPN transistor, and such buried layer is used as an injector of the PNP transistor.

According to another embodiment of the present invention, there is provided a semiconductor integrated circuit device of the type characterized in that the injector of the PNP transistor is constituted from a buried layer formed at a portion in the emitter region other than that immediately below the collector region of the NPN transistor acting as an inverter.

In still another embodiment of the present invention, there is provided a method of producing the above-mentioned type of semiconductor integrated circuit device characterized in that impurities of the same conductivity type as the collector are partially introduced into the buried injector region formed in the previous step and positioned immediately beneath the semiconductor zone where the collector region is to be formed, by employing ion-implantation technology and also using a mask for forming the collector region of the NPN transistor acting as an inverter by diffusion, and thereafter or therebefore, the collector region of an NPN transistor is formed by diffusion using the mask.

Now the present invention will be apparent from the following description of preferred embodiments thereof as illustrated in the accompanying drawings.

DESCRIPTION OF THE PREFERRED EMBODIMENTS

Figure 1A:
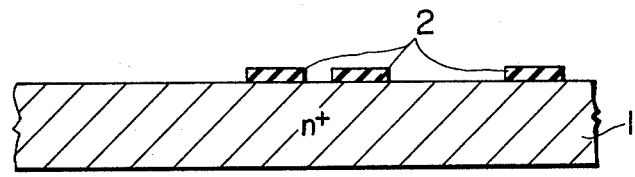
FIG. 1a to FIG. 1k are sectional views of a semiconductor integrated circuit in each step of the manufacturing process according to one embodiment of the present invention.
Figure 1B:
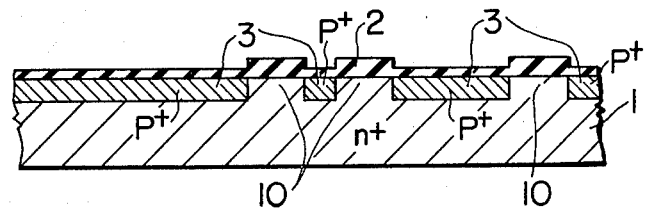
Figure 1C:
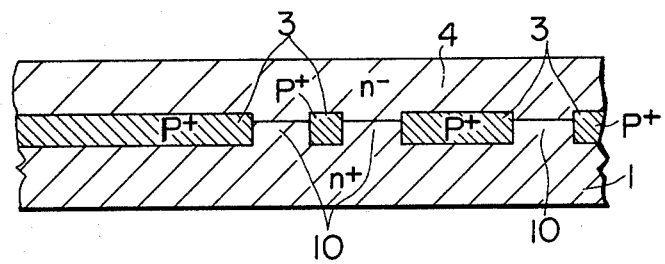
Figure 1D:
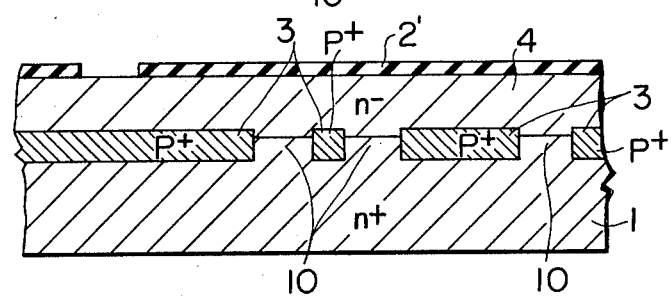
Figure 1E:
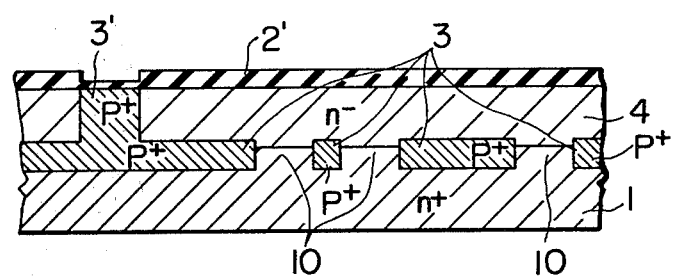
Figure 1F:
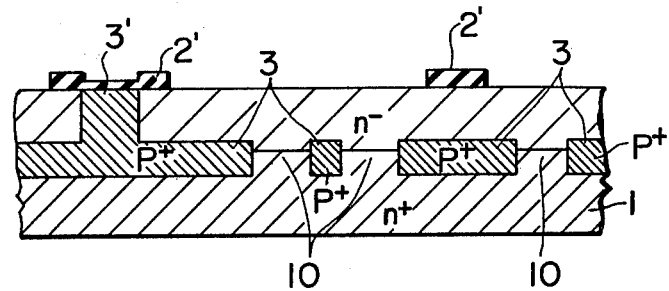
Figure 1G:
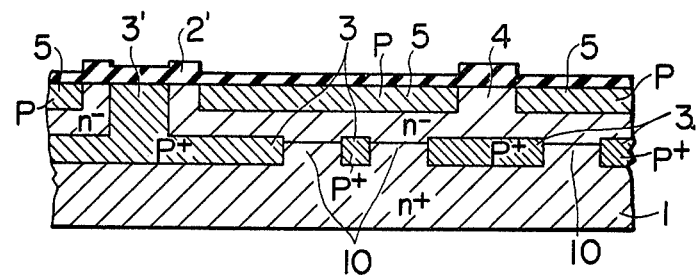
Figure 1H:
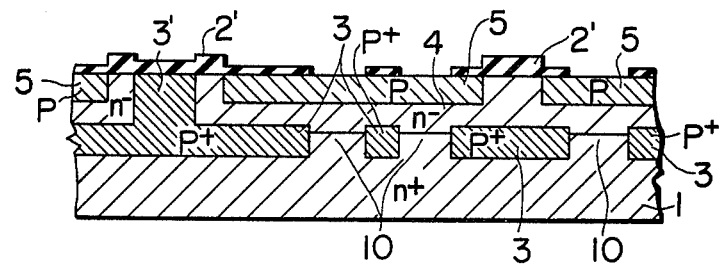
Figure 1I:
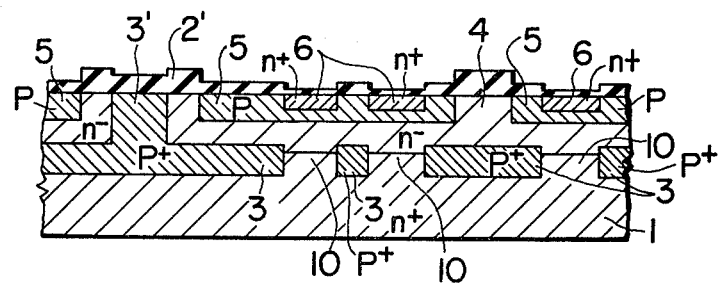
Figure 1J:
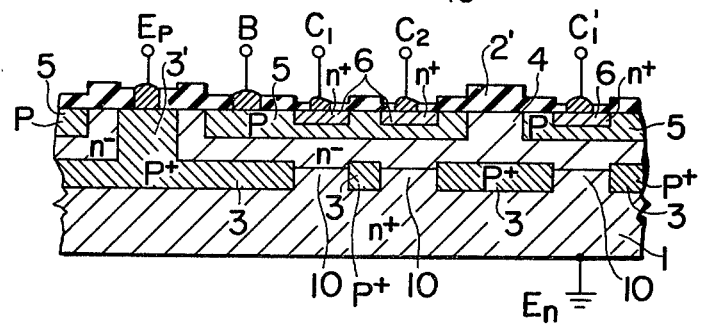

Referring now to FIG. 1a to FIG. 1j, there are shown sectional views illustrating the sequential steps in the process for manufacturing the I$^2$L circuit according to the present invention. The particulars of these steps are as follows.

Step (a); A silicon oxide (SiO$_2$) layer 2 is formed on the surface of the n+ semiconductor substrate 1 by known techniques, and then part of this SiO$_2$ layer 2 is selectively removed to expose the portions which are to be positioned immediately beneath the collector region of an NPN transistor which is formed in an ensuing step to act as an inverter.

Step (b); A p+ is formed by known diffusion techniques by using the SiO$_2$ layers 2 as a mask. This p+ region 3 is utilized as an injector, and all of the portions of said region 3, except for the hole portions 10, are interconnected. Thus, injector 3 is formed as a mesh.

Step (c); The SiO$_2$ layer 2 is entirely removed, and in its place an n$^-$ semiconductor layer 4 is formed by a known epitaxial growth method, whereby the injector region 3 is buried in the semiconductor layer.

Step (d); In order to obtain contact with the buried injector region 3, there is formed a p+ semiconductor region which extends from the substrate surface to the injector region 3. Such a semiconductor region is formed by known diffusion techniques. An SiO$_2$ layer 2' is formed as a mask for the diffusion.

Step (e); A p+ region 3' is formed by diffusion techniques by using the SiO₂ layer 2' as a diffusion mask such that the region 3' reaches the injector 3.

Step (f); The SiO₂ layer 2' is selectively removed to form a mask for selectively diffusing the base of an NPN transistor acting as an inverter (the base also acting as the collector of a PNP transistor serving both as a constant current source and as a load).

Step (g); Base 5 of the NPN transistor acting as an inverter is formed by diffusion, using the SiO₂ layer 2' as a mask.

Step (h); The SiO₂ layer 2' is selectively removed to form a mask for diffusing the collector of the transistor acting as an inverter.

Step (i); Collector 6 of the transistor acting as an inverter is formed by diffusion, using said SiO₂ layer as a mask.

Step (j); A ground terminal En is provided on the reverse side of the substrate 1 while also providing a power source terminal Ep in the p+ region 3' connected to the injector 3, an input terminal B in the base 5 of transistor acting as an inverter, and output terminals C₁ and C₂ for the respective collectors 6.

Figure 1K:
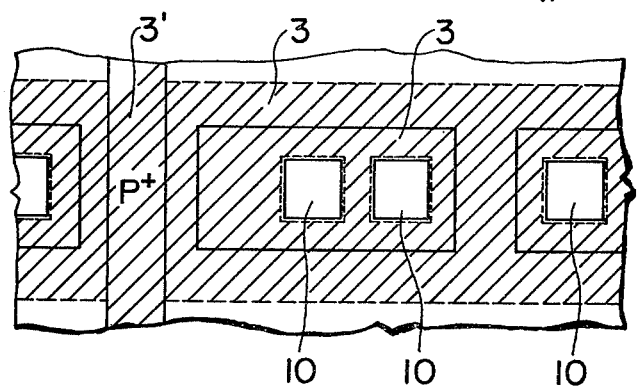

According to the above-described embodiment of the present invention, the NPN transistor acting as an inverter is constituted from a semiconductor structure comprising emitter 1, base 5 and collector 6, while the PNP transistor acting as both a constant current source and a load is constituted from a semiconductor structure comprising emitter 3, base 4 and collector 5. In this construction, the emitter region or injector region 3 of the PNP transistor is entirely buried except for the portions 10 immediately below the collector region 6 of the NPN transistor, as shown by the broken lines in FIG. 1k. Thus, since the emitter (injector) of the PNP transistor acting as a constant current source and a load is provided as a buried layer and this transistor is formed as a vertical structure, it is possible to control the base width of the transistor by adjusting the diffusion depth. This enhances the carrier injection efficiency while elevating the operating speed. Substantial area savings are also ensured as the emitter (injector) is formed inside the assembly.

Further, since the injector is present in a portion other than that immediately beneath the collector of the NPN transistor acting as an inverter, the emitter of the NPN transistor is provided in correspondence with the collector, and hence invalid portions of carriers injected from the emitter are decreased, to allow a reduction in the reactive power.

As is apparent from the foregoing explanation, the I²L circuit according to the present invention is capable of reducing the product of switching speed x power consumption, thus allowing an increased switching speed. Substantial area savings can be also provided.

Figure 2:
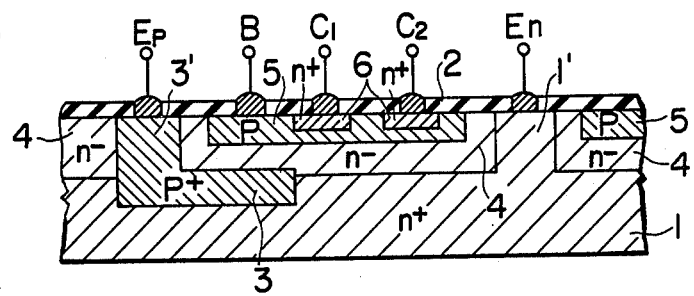
FIG. 2 is a sectional view of a semiconductor integrated circuit according to another embodiment of the present invention.
Figure 3A:
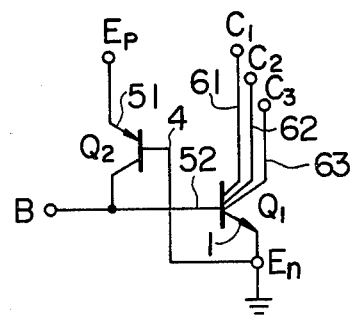
FIG. 3a is a known I$^2$L circuit diagram.
Figure 3B:
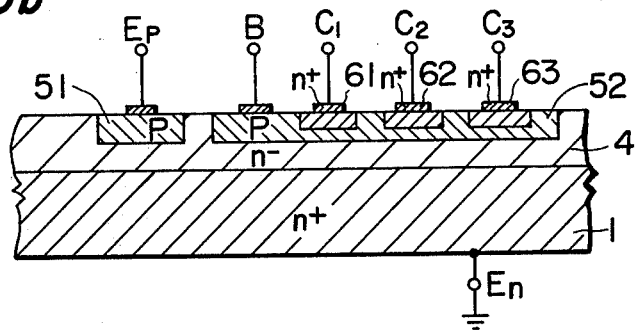
FIG. 3b is a sectional view of an I$^2$L circuit formed by the known techniques.
Figure 4:
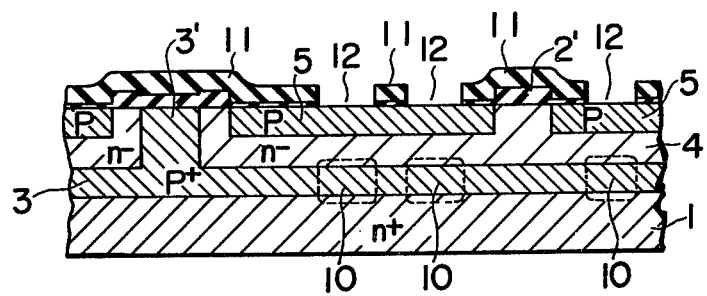
FIG. 4 is a sectional view of a semiconductor integrated circuit in one step of the manufacturing process which was partly modified from the process shown in FIGS. 1a –1k.

The present invention can be embodied in various other ways. For instance, as is shown in FIG. 4, a p-type injector region 3 may be previously formed over the entire surface, and then a photo-resistant layer 11 may be formed over the entire surface thereof except for the portions where the collectors of the NPN transistors are to be formed, by utilizing a glass mask for forming the collectors of the NPN transistors. Then, n-type impurities are introduced into the areas 10 spaced apart from the surface of the semiconductor substrate through openings 12 in the photo-resistant layer 11 by using ion-implantation technology, and thereafter n-type collector regions are formed by diffusion through the same openings 12. In this case, since the mask for forming the injector 3 and that for forming the collector 6 are the same, positional aberrations between the injector 3 and collector 6 can be corrected, allowing a reduction in the reactive power. Also, injector 3 can be provided at any part, provided that it is positioned immediately below the NPN transistors but not immediately below their collectors, as shown in FIG. 2. In this case, although the effect of reducing the reactive power in the NPN transistors is decreased as compared with the previous embodiment, better area savings and switching speed are provided than with the conventional I²L circuits. Also, the common emitter may be arranged such that the electrode is provided from the substrate surface as shown in the same drawings.

What is claimed is:

1. A method of manufacturing a semiconductor device including the steps of:
    (a) preparing a semiconductor body including a first semiconductor layer of a first conductivity type;
    (b) forming a second semiconductor layer of said first conductivity type having an impurity concentration that is lower than that of said first semiconductor layer on said first semiconductor layer;
    (c) forming a first semiconductor region having a second conductivity type opposite to that of said first conductivity type in said first semiconductor layer, to serve as the base region of a transistor;
    (d) forming a second semiconductor region having said first conductivity type in said first semiconductor region to serve as the collector region of said transistor;
    (e) introducing an impurity having said first conductivity type into said second semiconductor layer between said first semiconductor layer and said first semiconductor region and under said second semiconductor region to form a third semiconductor region that has an impurity concentration which is higher than that of said second semiconductor layer and to serve as the emitter region of said transistor.

2. A method of manufacturing a semiconductor device according to claim 1, wherein step (e) is carried out prior to step (d).

3. A method of manufacturing a semiconductor device according to claim 2, wherein said step (e) is carried out by using ion implantation technology.

4. A method of manufacturing a semiconductor device according to claim 1, further comprising the step of forming a fourth semiconductor region having a second conductivity type opposite to said first conductivity type in said first semiconductor layer to provide the emitter region of another transistor; the second semiconductor layer of said first conductivity type providing the base of said another transistor and the first semiconductor region providing the collector region of said another transistor.

5. A method of manufacturing a semiconductor device according to claim 4, further comprising the step of forming another semiconductor region of the same conductivity type as the fourth semiconductor region that extends from said fourth semiconductor region to an exposed surface of said device.

* * * * *